United States Patent
Heid et al.

(10) Patent No.: US 7,388,376 B2
(45) Date of Patent: Jun. 17, 2008

(54) OPTIMIZED METHOD FOR PREVENTION OF FOLDOVER ARTIFACTS IN MAGNETIC RESONANCE TOMOGRAPHY

(75) Inventors: Oliver Heid, Gunzenhausen (DE); Thomas Kluge, Hirschaid (DE)

(73) Assignee: Siemens Aktiengesellschaft, Munich (DE)

( * ) Notice: Subject to any disclaimer, the term of this patent is extended or adjusted under 35 U.S.C. 154(b) by 162 days.

(21) Appl. No.: 11/265,002

(22) Filed: Nov. 2, 2005

(65) Prior Publication Data
US 2006/0122485 A1 Jun. 8, 2006

(30) Foreign Application Priority Data
Nov. 2, 2004 (DE) ............... 10 2004 052 894

(51) Int. Cl.
*G01V 3/00* (2006.01)
*A61B 5/055* (2006.01)
(52) U.S. Cl. ............ 324/307; 324/309; 324/318; 600/410; 600/411
(58) Field of Classification Search ........... 324/307, 324/318, 309; 600/410, 411
See application file for complete search history.

(56) References Cited

U.S. PATENT DOCUMENTS

| | | | | |
|---|---|---|---|---|
| 5,125,407 A | * | 6/1992 | Harms et al. | 600/410 |
| 5,684,400 A | * | 11/1997 | Tsukamoto et al. | 324/309 |
| 2005/0007113 A1 | * | 1/2005 | Hoogeveen et al. | 324/309 |
| 2005/0038336 A1 | | 2/2005 | Nimsky | 600/410 |
| 2006/0122485 A1 | * | 6/2006 | Heid et al. | 600/410 |

FOREIGN PATENT DOCUMENTS

WO WO 03/046598 A1 * 6/2003

OTHER PUBLICATIONS

The Relationship Between the Nyquist Criterion and the Point Spread Function, Sarty, Concepts in Magnetic Resonance Part B, vol. 17B(1) pp. 17-24 (2003).

* cited by examiner

*Primary Examiner*—Tiffany A Fetzner
(74) *Attorney, Agent, or Firm*—Schiff Hardin LLP (57) ABSTRACT

In an MRT method and apparatus with oversampling in at least one phase coding direction of a first region of interest to be visualized, an overview slice image is acquired across the entire subject to be examined in a selected slice, a marking input of the first image region of interest to be measured is detected in the overview slice image, and the first image region is expanded in at least one phase coding direction, dependent on the geometry of the first image region, the overview slice image, as well as the relative position of both image regions relative to one another, such that an expanded, oversampled second image region is obtained that completely contains the first image region and is foldover-free in this first image region.

14 Claims, 6 Drawing Sheets

FREQUENCY CODING DIRECTION

PHASE CODING DIRECTION

FIG 3B

FREQUENCY CODING DIRECTION

PHASE CODING DIRECTION

OPTIMIZED METHOD FOR PREVENTION OF FOLDOVER ARTIFACTS IN MAGNETIC RESONANCE TOMOGRAPHY

BACKGROUND OF THE INVENTION

1. Field of the Invention

The present invention in general concerns magnetic resonance tomography (MRT) as employed in medicine for examination of patients. The present invention in particular concerns an MRT method with over-sampling in at least one phase coding direction of an image region to be visualized.

2. Description of the Prior Art

MRT is based on the physical phenomenon of nuclear magnetic resonance and has been successfully used as an imaging method for over 15 years in medicine and biophysics. In this modality, the subject is exposed to a strong, constant magnetic field. The nuclear spins of the atoms in the subject, which were previously randomly oriented, thereby align. Radio-frequency energy can now excite these ordered nuclear spins to a specific oscillation. This oscillation generates the actual measurement signal, which is acquired by appropriate reception coils. By the use of non-homogeneous magnetic fields generated by gradient coils, the measurement subject can be spatially coded in all three spatial directions, generally known as "spatial coding".

The acquisition of the data ensues in MRT in k-space (frequency domain). The MRT image in the image domain is linked with the MRT data in k-space by means of Fourier transformation. The spatial coding of the subject, which spans k-space, ensues in all three spatial directions by means of gradients. Differentiation is made between the slice selection (establishes an acquisition slice in the subject, typically the z-axis), the frequency coding (establishes a direction in the slice, typically the x-axis) and the phase coding (determines the second dimension within the slice, typically the y-axis). Moreover, the selected slice can be sub-divided into further slices by an additional second phase coding along the z-axis.

A slice is thus first selectively excited (for example in the z-direction) and a phase coding in the z-direction is possibly conducted. The coding of the spatial information in the slice ensues with a combined phase and frequency coding by means of both of these aforementioned orthogonal gradient fields, that in the example of a slice excited in the z-direction are generated by the gradient coils in the x-direction and the y-direction, respectively.

Figure 2A:
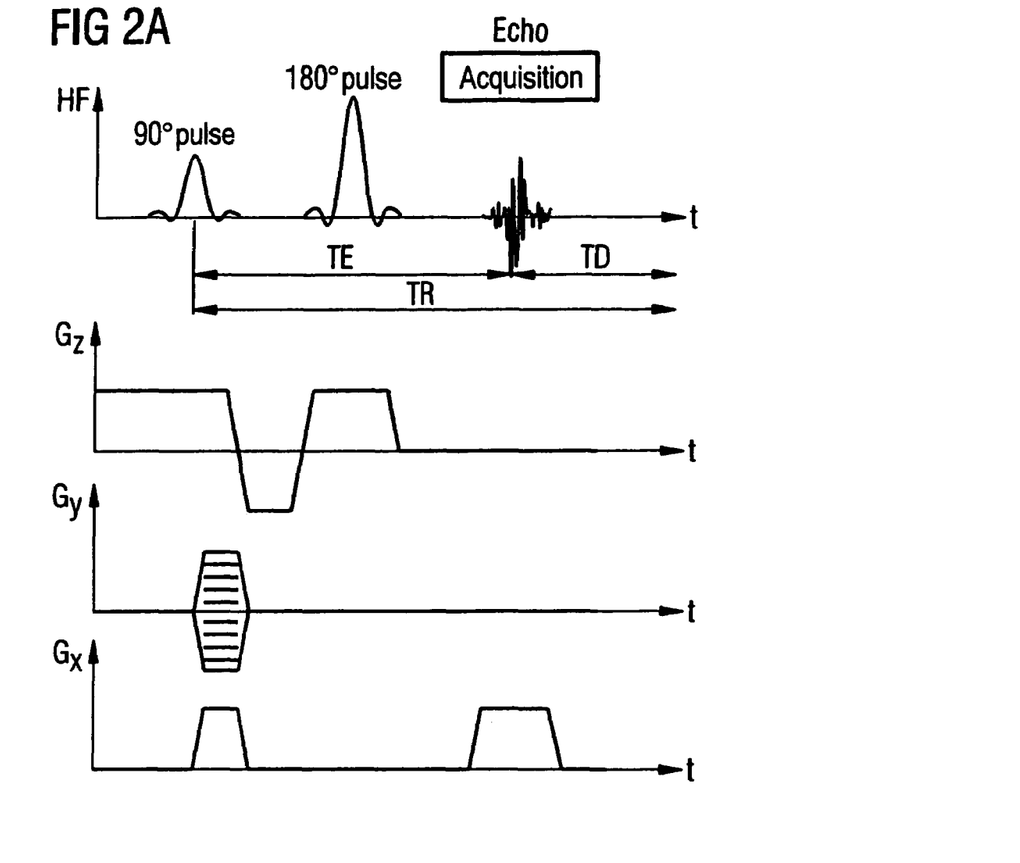
FIG. 2A schematically shows the time curve of the pulses of a known spin-echo sequence.
Figure 2B:
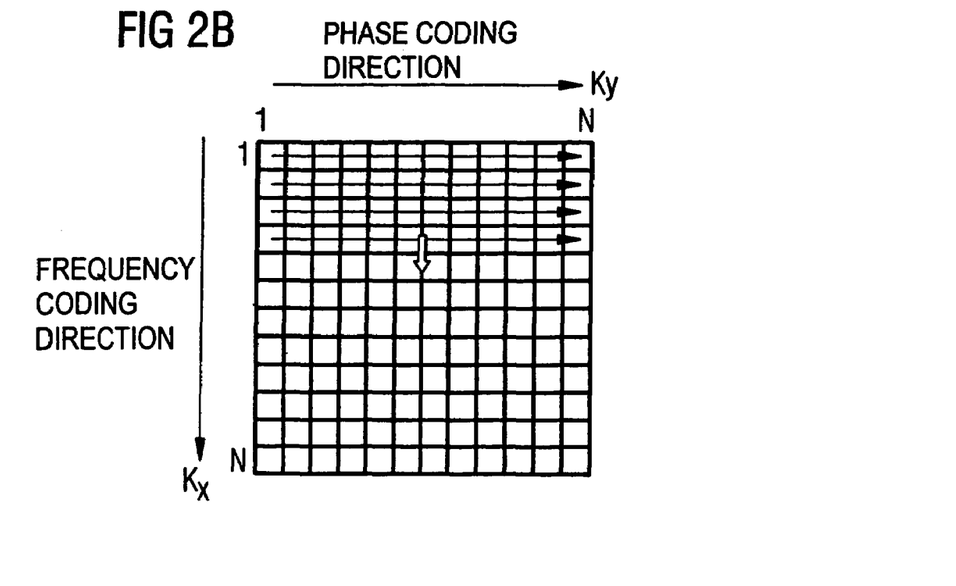
FIG. 2B schematically shows the temporal sampling of the k-matrix for a spin-echo sequence according to FIG. 2A.

A possible pulse sequence to acquire the data in an MRT experiment is shown in FIGS. 2A and 2B. The sequence is a spin-echo sequence. In this, the magnetization of the spin is tilted in the x-y plane by a 90° excitation pulse. In the course of time ($\frac{1}{2}$ $T_E$; $T_E$ is the echo time) a dephasing occurs of the magnetization components that mutually form the transverse magnetization in the x-y plane $M_{xy}$. After a certain time (for example, $\frac{1}{2}$ $T_E$), a 180° pulse is radiated in the x-y plane such that the dephased magnetization components are reflected without the precession direction and precession speed of the individual magnetization portions being changed. After a further time duration TD, which may be $\frac{1}{2}$ $T_E$, the magnetization components again point in the same direction, i.e. a regeneration of the transverse magnetization occurs, designated as a "rephasing". The complete regeneration of the transverse magnetization is designated as a spin-echo.

In order to measure an entire slice of the subject to be examined, the imaging sequence is repeated N-times for different values of the phase coding gradient, for example $G_y$. The temporal separation of the respectively excited RF pulses is designated as a repetition time TR. The magnetic resonance signal (spin-echo signal) is likewise sampled, digitized, and stored N times in every sequence repetition via the Δt-clocked ADO (analog-digital converter) in equidistant time steps Δt in the presence of the read-out gradient $G^x$. In this manner, a numerical matrix is created row by row (matrix in k-space, or k-matrix) with N×N data points, as shown in FIG. 2B. An MR image of the slice in question with a resolution of N×N pixels can be directly reconstructed from this data set via a Fourier transformation (a symmetric matrix with N×N points is only one example, asymmetrical matrices can be generated as well).

The measured MRT signal, which defines a value of the k-matrix is described by the amplitude, the frequency and the phase of the signal. In MR tomography, the amplitude contains the information about the spin density, while frequency and phase of the signal are used for spatial coding of the respective spatial directions.

In contrast to the frequency coding, the phase coding gradient (for example $G_y$ is only between excitation and acquisition for a fixed duration. All spins do in fact precess again with the same resonance frequency after the switching of the phase coding gradient, but they now possess a spatially-dependent phase. As can be seen in FIG. 2A, the duration of the phase coding gradient is kept constant so that the phase depends only on the spatial direction (for example y-direction) to be coded as well as on the respective gradient amplitude $G_y$. The phase of the signal changes linearly with the spatial direction (y-direction). A defined phase modulation of the nuclear magnetic resonance signals thus ensues for every gradient amplitude.

So that the association of the phase modulation is unambiguous for each phase coding step, and thus for the entirety of all phase coding steps, the region of interest to be measured of the subject to be examined cannot exceed a delimited range in the phase coding direction. The range in which signals can be unambiguously associated with a position is designated as a field of view (FOV). When the region of interest (ROI) or the subject itself lies within the FOV, all subject positions are unambiguously determined via the phase modulation of a plurality of phase coding steps. If the region of interest lies partially outside of the FOV, it leads to ambiguities. In the image the portion of the ROI or the subject that is beyond an edge of the FOV is projected over the other side of the portion within the FOV. This is known as a foldover artifact (also called aliasing or backfolding or phase wrapping or wrap around artifacts).

Figure 3A:
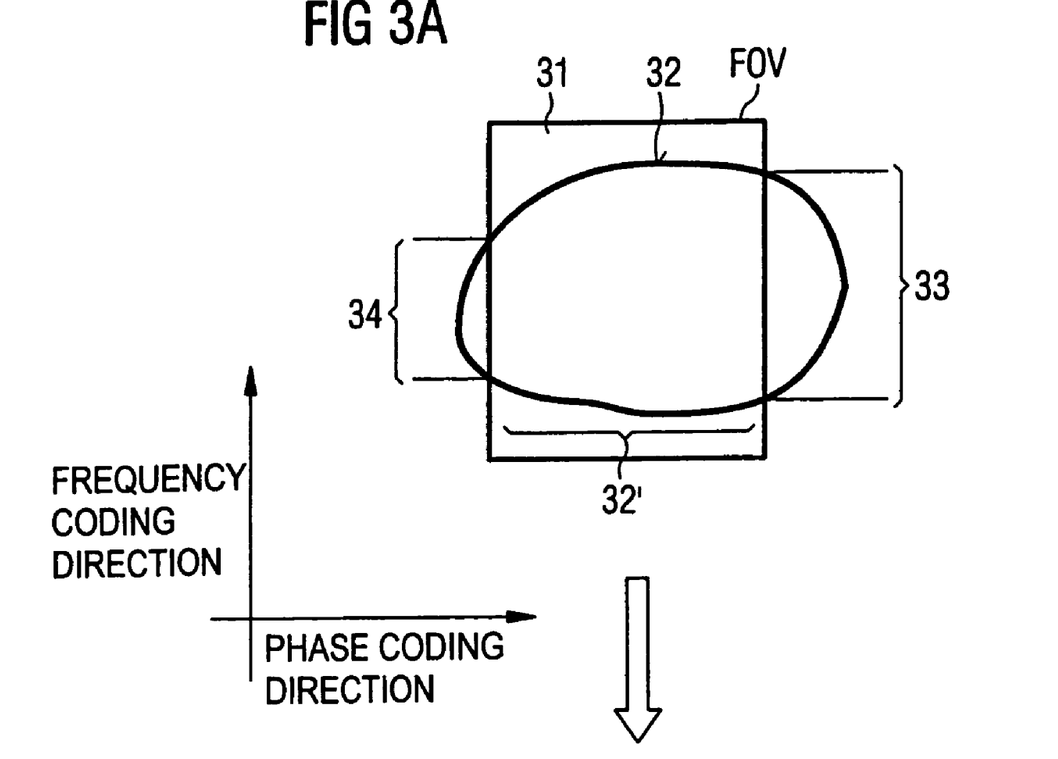
FIG. 3A schematically shows an initial situation of a region to be scanned relative to a subject to be examined, which initial situation leads to foldovers in the region to be scanned.
Figure 3B:
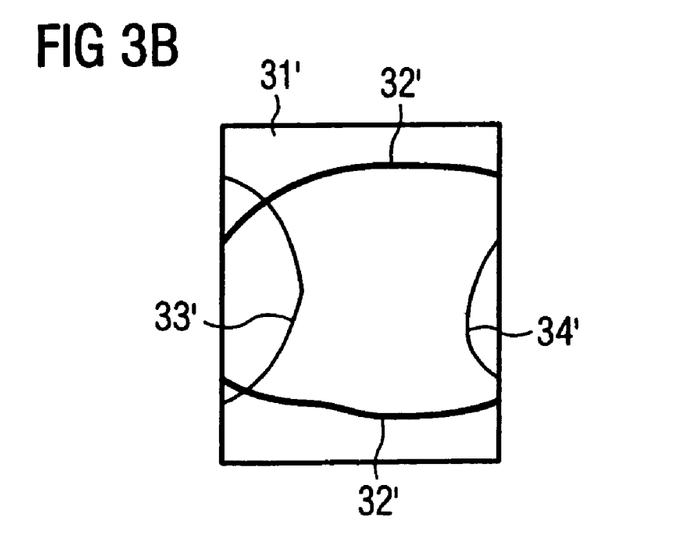
FIG. 3B schematically shows the foldover artifacts in the reconstructed image that have been caused by the situation of FIG. 3A.

Foldovers thus arise in subject structures that lie in the measurement slice but outside of the image field (FOV; normally rectangular) marked by the user in the measurement slice in the phase coding direction. This is due to the fact that the phase coding gradient exhibits a periodicity and is only distinct from 0° to 360°. This fact is illustrated using FIGS. 3A and 3B: the MRT apparatus cannot differentiate between 370° and 10°, which is why the part 33 of the subject 32 (which, for example, protrudes to the right from the image region (FOV) 31 in FIG. 3A in the phase coding direction at 370°) is folded (wrapped around) into the image region again at 10° on the left side 33' of the reconstructed image 31' that contains the subject 32', as shown in FIG. 3B. In reverse, the part 34 of the subject 32 (that, for example, likewise protrudes to the left from the image region 31 in FIG. 3A in the phase coding direction at −5°) folds into the image region 31' (at 355°) again on the right side 34' of the reconstructed image 31'.

The subject structure 32' completely located in the FOV, however, is unambiguously imaged in the reconstructed image.

Figure 4A:
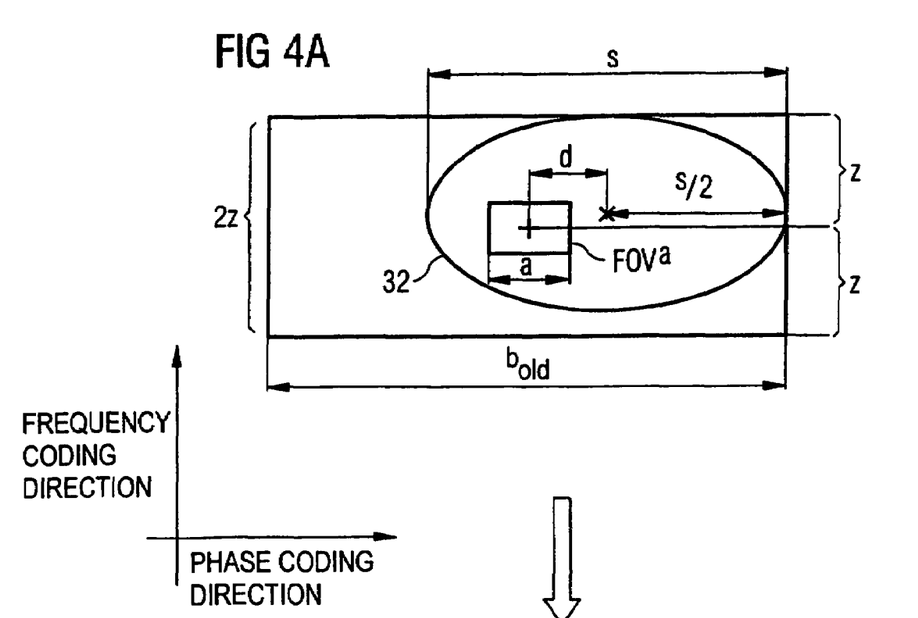
FIG. 4A schematically shows the expansion of the FOV according to the prior art in order to prevent foldovers in the reconstructed image.

The simplest manner to prevent or avoid these foldovers is to align the phase coding direction such that subject structures no longer protrude into this from the image region. In the most common case—see FIG. 4A, in which the image region (the FOV) is surrounded on all sides by subject structures—this is not possible.

In this case, a method according to the prior art proceeds as follows:

After an overview slice image of the entire subject in the measurement plane of interest has been acquired in an initial "scout image" procedure, and the image region of interest $FOV^a$ of the width "a" has been indicated by the user in the phase coding direction, both sides of the initial $FOV^a$ are expanded from its center point so far that a $Fov^{b\ old}$ is created which completely contains the subject.

In terms of calculation, the expansion in the phase coding direction $b_{old}$ is determined from the overall width of the subject in the phase coding direction s as well as the distance d of the center point of the starting image region $FOV^a$ to the center point of the subject in the phase coding direction according to the equation $$b_{old} = \frac{s}{2} + \frac{s}{2} + 2|d|$$
$$= s + 2|d|$$

In order to not commit to a specific phase coding direction, an image enlargement in the frequency coding directly (vertical in FIGS. 4A, 4B) is likewise effected according to the same method (i.e., replacing s with z and replacing d with the vertical offset of the center of $FOV^a$ from the center of the subject region 32), such that ultimately the image region is expanded so far that a subject region 32 no longer protrudes from the new $FOV^{b\ old}$. This has the consequence that foldovers are not generated anymore given a scan of the widened $FOV^{b\ old}$ parallel or perpendicular to a in the initial image region $FOV^a$.

Figure 4B:
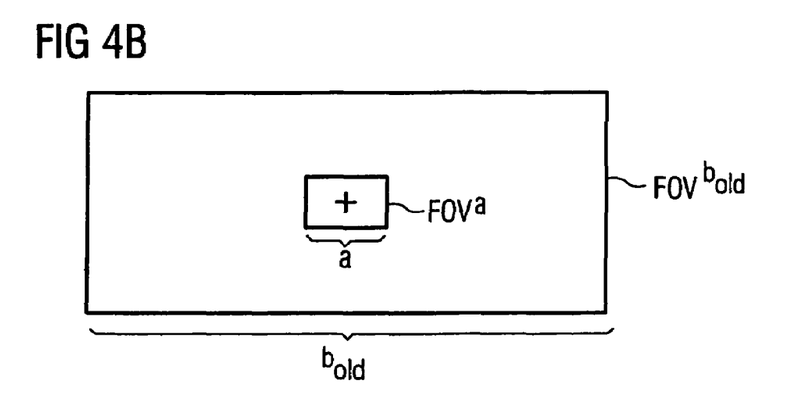
FIG. 4B schematically shows the FOV expanded according to FIG. 4A relative to the actual FOV of interest.

A significant disadvantage of this method is the fact that an oversampling of the current image region of interest $FOV^a$ of width "a" occurs (4B), that not only lengthens the scan duration by multiple times, but also demands multiple times the memory storage space.

SUMMARY OF THE INVENTION

An object of the present invention is to provide an MRT method that prevents foldovers by an optimized oversampling of the image region (FOV) in the phase coding direction with a simultaneous reduction of the measurement data as well as the measurement duration.

This object is achieved according to the present invention by a magnetic resonance tomography method with oversampling in at least one phase coding direction of a first image region of interest to be visualized, wherein an overview slice image is acquired across the entire subject to be examined in a selected slice, a marking input of the first image region of interest to be measured is detected in the overview slice image, the first image region is expanded in at least one phase coding direction, dependent on the geometry of the first image region, the overview slice image as well as the relative position of both image regions relative to one another, such that an expanded, oversampled second image region is obtained that completely contains the first image region and is foldover-free in this first region.

The aforementioned geometry in accordance with the invention concerns the width a of the first image region in the phase coding direction, the maximal subject width s of a parallel projection (defined by a) of the first image region through the overview slice image in the projection direction as well as the distance d in the phase coding direction as a distance of the center point of the first image region to the center point of the projection defined by the values a as well as s.

The expansion of the width a of the first image region to a width b can ensue according to the equation $$b = \frac{a+s}{2} + |d|$$

The method is furthermore additionally, advantageously applied along a second phase coding direction.

The expansion inventively ensues such that the center of the second image region comes to lie optimally close to the center of the homogeneity volume M of the basic magnetic field.

The above object also is achieved by an MRT apparatus that implements the above-described method.

The above object also is achieved by a computer software product in the form of a storage medium encoded with program data, that runs in a computer connected to a magnetic resonance tomography apparatus to cause the apparatus to implement the above-described method.

DESCRIPTION OF THE PREFERRED EMBODIMENTS

Figure 1:
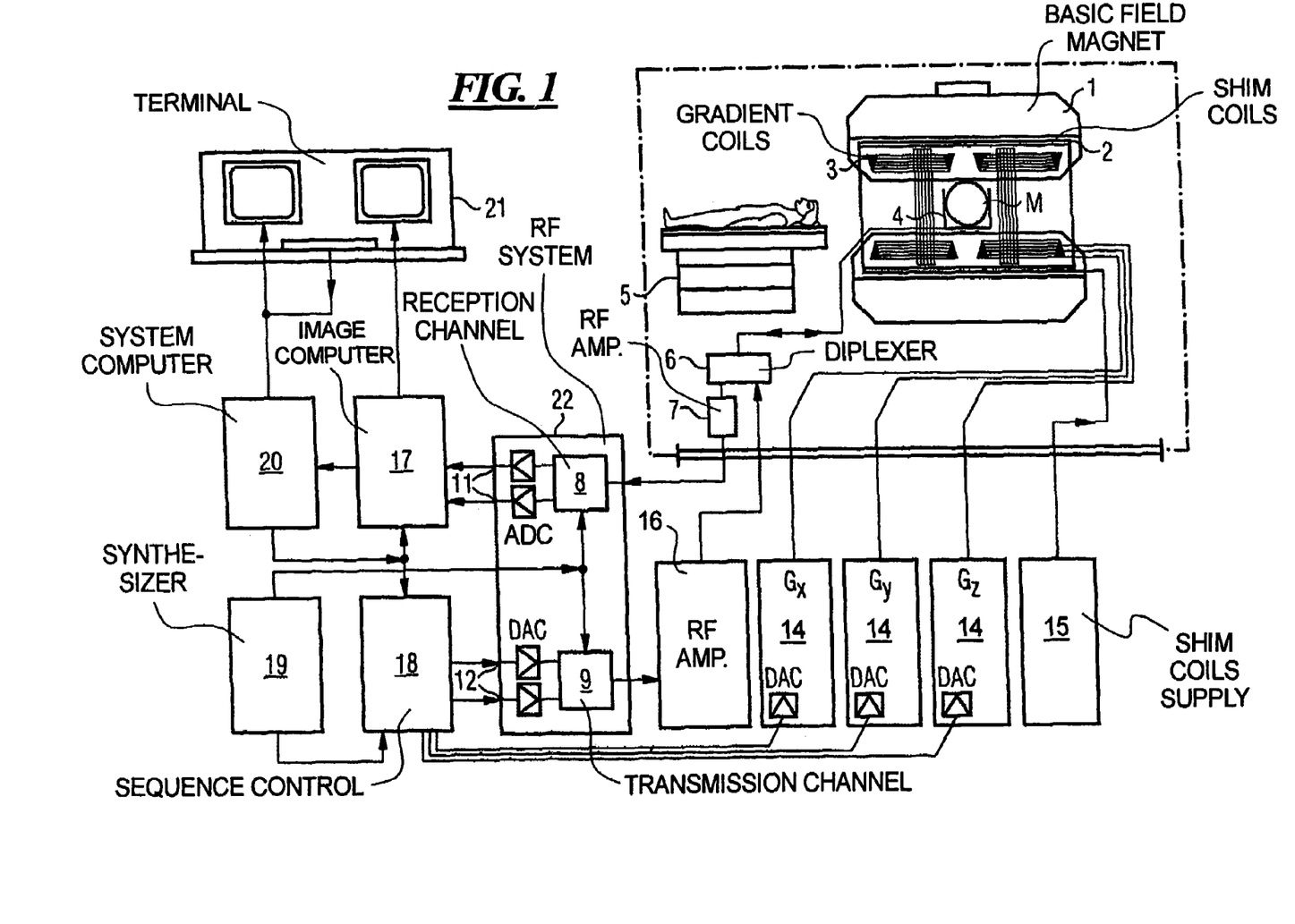
FIG. 1 schematically illustrates a magnetic resonance tomography apparatus operable in accordance with the invention.

FIG. 1 schematically illustrates a magnetic resonance tomography apparatus with which MRT measurements are possible according to the present invention in the regions marked by the user. The design of the nuclear magnetic resonance tomography apparatus corresponds to that of a conventional tomography apparatus, with the exception described below. A basic field magnet 1 generates a temporally-constant strong magnetic field for polarization or alignment of the nuclear spins in the examination region of a subject such as, for example, of a part of a human body to be examined. The subject is moved into and out of the basic field magnet 1 by a subject table 5 The high homogeneity of the basic magnetic field necessary for the magnetic resonance measurement is defined in a spherical measurement volume M into which the parts of the human body to be examined are introduced. To support the homogeneity requirements, and in particular for elimination of temporally invariable influences, shim plates made from ferromagnetic material are mounted at a suitable location. Temporally variable influences are eliminated by shim coils 2 that are activated by a shim current supply 15.

A cylindrical gradient coil system 3 that is composed of three windings is used in the basic field magnet 1. Each winding is supplied with current by an amplifier 14 for generation of a linear gradient field in the respective directions of the Cartesian coordinate system. The first coil of the gradient field system 3 generates a gradient $G_x$ in the x-direction, the second sub-coil generates a gradient $G_y$ in the y-direction, and the third coil generates a gradient $G_z$ in the z-direction. Each amplifier 14 contains a digital-analog converter that is operated by a sequence controller 18 for accurately timed generation of gradient pulses.

Located within the gradient field system 3 is a radio-frequency antenna 4 that converts the radio-frequency pulses emitted by a radio-frequency power amplifier 30 into a magnetic alternating field for excitation of the nuclei and alignment of the nuclear spins of the subject to be examined, or of the region of the subject to be examined. The alternating field originating from the precessing nuclear spins (normally the nuclear spin echo signals caused by a pulse sequence composed of one or more radio-frequency pulses and one or more gradient pulses) is also converted by the radio-frequency antenna 4 into a voltage that is supplied via an amplifier 7 to a radio-frequency receiver channel 8 of a radio-frequency system 22. The radio-frequency system 22 furthermore has a transmission channel 9 in which are generated the radio-frequency pulses for the excitation of the magnetic resonance signals. The respective radio-frequency pulses are digitally represented in the sequence controller 18 as a series of complex numbers based on a pulse sequence predetermined by the system computer 20. This number series is supplied as a real part and an imaginary part via respective inputs 12 to a digital-analog converter in the radio-frequency system 22, and from this to a transmission channel 9. In the transmission channel 9, the pulse sequences are modulated with a radio-frequency carrier signal, the base frequency of which corresponds to the resonance frequency of the nuclear spins in the measurement volume.

Switching from transmission mode to reception mode ensues via a transmission-reception diplexer 6. The radio-frequency antenna 4 radiates the radio-frequency pulses into the measurement volume M for excitation of the nuclear spins and samples the resulting echo signals. The acquired magnetic resonance signals are phase-sensitively demodulated in the reception channel 8 of the radio-frequency system 22 are converted into a real part and an imaginary part of the measurement signal in an analog-digital converter, and the real part and imaginary part are supplied via respective inputs 11 to an image computer 11. An image is reconstructed by an image computer 17 from the measurement data acquired in this manner. The administration of the measurement data, the image data and the control programs ensues via a system computer 20. Based on control programs, the sequence controller 18 monitors the generation of the respectively desired pulse sequences and the corresponding sampling of k-space. The sequence controller 18 controls the accurately timed switching of the gradients, the emission of the radio-frequency pulses with defined phase and amplitude and the receipt of the magnetic resonance signals. The time base for the radio-frequency system 22 and the sequence controller 18 is provided by a synthesizer 19. The selection of corresponding control programs for generation of a magnetic resonance image as well as the representation of the generated magnetic resonance image ensues via a terminal 21 that has a keyboard as well as one or more screens.

The described MRT apparatus inventively has a calculation unit or image processing unit (for example in the system computer 20) that detects the respective geometry according to the inventive method in the fundamental overview slice images ("scout images") as well as the initial image regions of interest ($FOV^a$) indicated therein (which should be displayed without foldovers) and, based on this knowledge, effects the inventive expansion of the initial image regions to produce expanded image regions ($FOV^b$) before the measurement.

The inventive method along one dimension is explained in the following using FIGS. 5A and 5B. One-dimensional means that only one phase coding ensues and the expansion is also considered, or also ensues, only in this one phase coding direction.

Figure 5A:
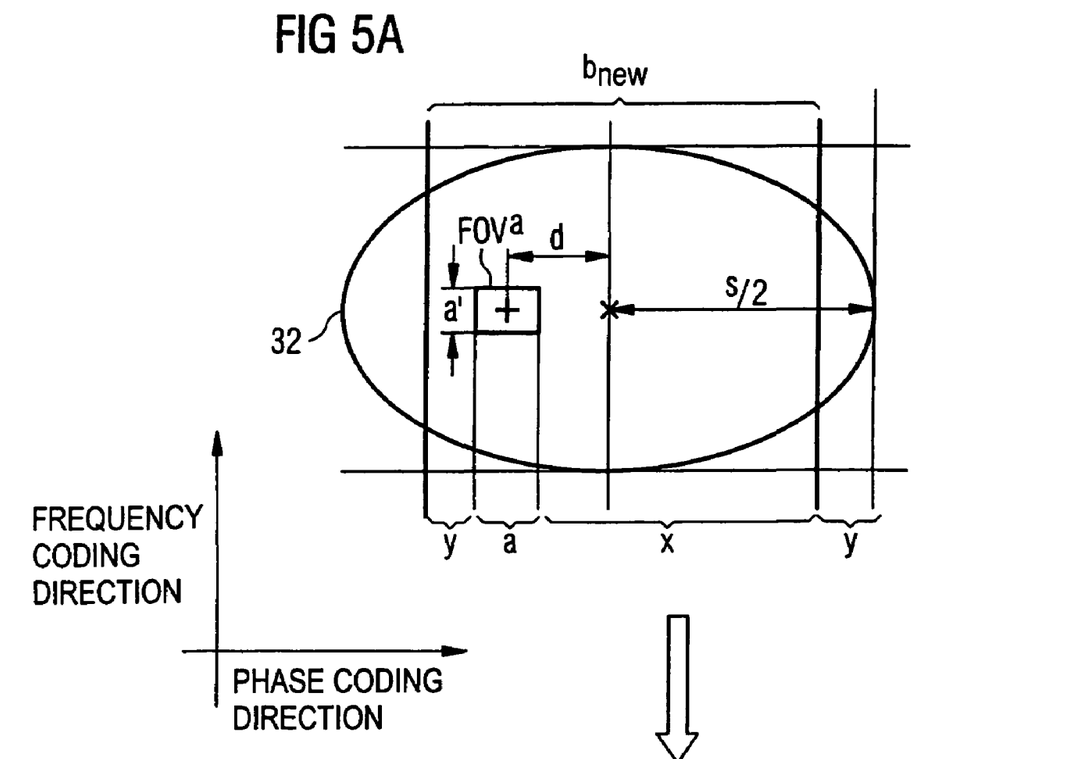
FIG. 5A schematically an embodiment for expansion of the $FOV^a$ in order to prevent foldovers in the reconstructed image in accordance with the invention.

An oval subject structure 32 is shown in FIG. 5A, which represents an overview slice image of the subject to be examined in the phase coding-frequency coding plane. A rectangular image region ($FOV^a$) with the width a in the phase coding direction as well as the width a' in the frequency coding direction is indicated. For clarity, the center point $FOV^a$ was selected at the height of the subject center point. The separation of the two center points is d.

If an MRT measurement were now to ensue exclusively in the $FOV^a$, the entire subject structure would fold into $FOV^a$ on both sides from $FOV^a$ on a horizontal strip of the height a'.

One possibility to prevent this is to horizontally expand the $FOV^a$ to the right up to the right boundary of the subject structure. The entire relevant region to the right of the $FOV^a$ would be correctly measured as well in this manner and no longer fold into the $FOV^a$. The region to the left of $FOV^a$ up to the left boundary of the subject structure would in fact fold into the image region expanded to the right. However, this foldover would be limited to the expanded region to the right of the $FOV^a$ and the $FOV^a$ itself would remain foldover-free.

Figure 5B:
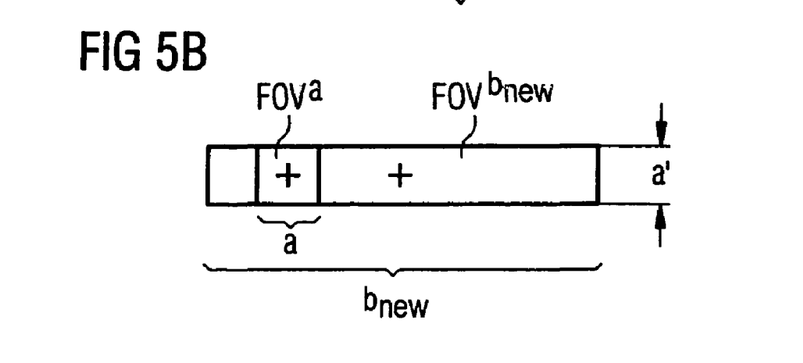
FIG. 5B schematically shows the $FOV^b$ new inventively expanded according to FIG. 5A relative to the actual $FOV^a$ of interest.

However, a more general solution is to expand the $FOV^a$ toward both sides. It should be taken into account that, by an expansion to the left (for example by the amount y (FIG. 5A)), the expansion to the right can be reduced by the amount y since the subject structure of the region reduced to the right exclusively folds into the left region expanded by y. Considered mathematically, this consideration leads to an inventively expanded FOV width $$b_{new} = a + x + y \qquad (1)$$

wherein x represents the expansion (reduced by y) of a side (in FIGS. 5A and 5B, the right side). The segments x and y, which are in fact dependent on one another but still are variable, can also be expressed by the quantities d and s of the subject geometry according to the equation $$\frac{a}{2} + x + y = \frac{s}{2} + |d| \qquad (2)$$

The substitution of the sum of x and y ((1) minus (2)) ultimately leads to the general expansion width $b_{new}$ according to the equation $$b_{new} = \frac{a+s}{2} + |d| \qquad (3)$$

wherein the magnitude of d takes into account the respective side of the $FOV^a$ relative to the subject center point.

The above equation (3) also shows that the expanded $FOV^{bnew}$ can and may be arbitrarily shifted in the phase coding direction relative to the initial image region $FOV^a$ as long as $FOV^a$ remains completely contained in $FOV^{bnew}$. This is graphically clear since an increasing undersampling on the one side is compensated by an increasing oversampling on the other side.

The initially-described special case is also thereby covered, in which special case both boundaries of both image regions ($FOV^a$, $FOV^{bnew}$) coincide, such that the opposite boundary of the expanded image region $FOV^{bnew}$ is flush with the subject boundary.

The possibility to be able to shift the expanded image region ($FOV^{bnew}$) relative to the initial image region ($FOV^a$) can be inventively, advantageously used, namely by displacing the $FOV^{bnew}$ such that its center point comes to lie optimally close to the center point or center of the homogeneity volume M (FIG. 1). It is thereby ensured that foldovers from the outer region of the $FOV^{bnew}$ are not still generated due to magnetic field inhomogeneities.

As already mentioned, in some cases it can be meaningful to effect a phase coding in two directions that are orthogonal to one another. The frequency coding then typically ensues perpendicular to the plane defined by first and second phase coding directions. In order to prevent foldover artifacts in such a case as shown in FIG. 6A, it is necessary to implement the inventive expansion of the initial image region $FOV^{aa'}$ in both phase coding directions.

Figure 6A:
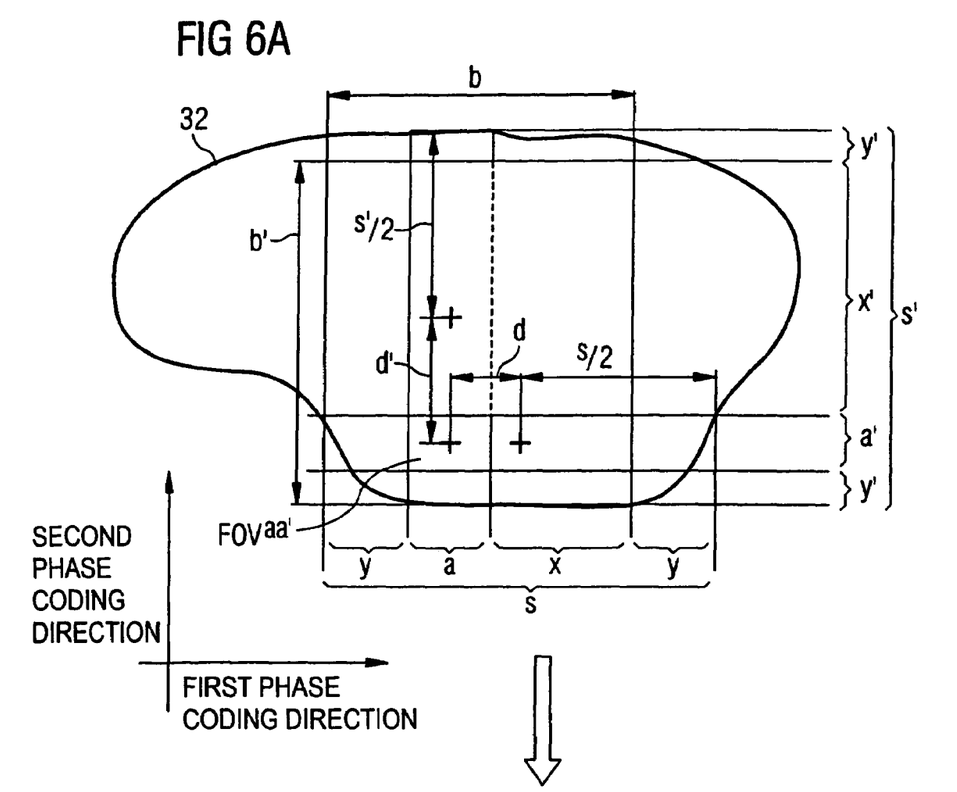
FIG. 6A schematically shows an inventive expansion of the $FOV^{aa'}$ along two phase coding directions in a special case of the subject geometry.

In FIG. 6A, a particular shape of the subject geometry as well as a special position of the initial image region are thereby provided in this geometry.

According to the overview slice image of the subject 32 that is shown in FIG. 6A (wherein designations from FIG. 5A are again shown), the subject tapers towards the bottom in this acquisition plane. The initial image region $FOV^{aa'}$ of the width a and the height a' is located in the tapered section, such that given an expansion of $FOV^{aa'}$ in the first phase coding direction the entire subject width does not have to be considered in this direction and enter into equation (3), rather only the maximum width s of the tapered segment within a parallel projection with the width a'.

In contrast to this, given an expansion of $FOV^{aa'}$ along the second phase coding direction the entire subject s' must be accounted for (with d' and s'/2 serving the representation as d and s/2 in the first phase coding direction).

For clarity, in the example of FIG. 6A the respective segment y or y' was selected such that the sum of a, x and 2y, or the sum of a', x' and 2y', forms the subject width s or s' to be considered.

Figure 6B:
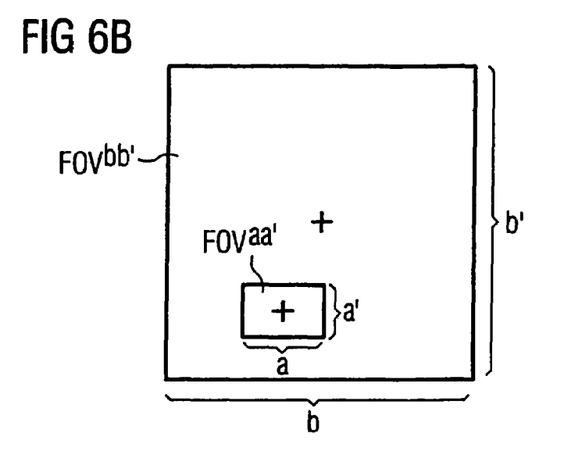
FIG. 6B schematically shows the $FOV^{bb'}$ inventively expanded according to FIG. 6A relative to the actual $FOV^{aa'}$ of interest to be imaged without foldovers.

In total, an expansion of the initial image region $FOV^{aa'}$ along both phase coding directions leads to an expanded image region $FOV^{bb'}$ that is shown in 6B as having width b and height b'. Here as well the expanded image region $FOV^{bb'}$ can (as in the one-dimensional case, FIG. 5B) be arbitrarily shifted relative to the initial image region $FOV^{aa'}$ as long as the region $FOV^{aa'}$ remains completely contained in the $FOV^{bb'}$. As already explained in the one-dimensional case, it is advantageous to shift the $FOV^{bb'}$ relative to $FOV^{aa'}$ such that the center point of $FOV^{bb'}$ comes to lie optimally near to the system center M.

It should be noted that both regions ($FOV^{aa'}$, $FOV^{bb'}$) are based on a pixel matrix whose pixel assignment is identical, meaning that its horizontal and vertical pixel pitches are the same. This leads to the situation that, given an expansion or shifting of the image regions, the coincidence (i.e. the overlapping) of all pixels of the overlap region must be taken into account. This, however, leads to a quasi-continuous expansion or shifting given a high pixel assignment density.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for operating a magnetic resonance tomography apparatus comprising:

acquiring magnetic resonance data from a single RF reception channel of a magnetic resonance tomography apparatus that represent an overview slice image across an entirety of a subject to be examined in a selected slice;

in said overview slice image, detecting a marking input of a first image region;

in a control unit of said magnetic resonance tomography apparatus, electronically expanding said first image region in at least one phase coding direction, dependent on a geometry of said first image region, said overview slice image and respective positions of said overview slice image and said first image region relative to each other, so as to identify a second image region that is expanded compared to said first image region;

with said control unit, operating said magnetic resonance tomography apparatus to acquire oversampled magnetic resonance data in said single RF reception channel from said second image region of said subject, that completely contains said first image region and that is free of foldovers in said first image region; and making said oversampled data accessible from said control unit in a form suitable for reconstructing a magnetic resonance image of said second image region by Fourier transformation.

2. A method as claimed in claim 1 comprising employing, as said geometry, a width a of said first image region in said at least one phase coding direction, a maximum width s of a parallel projection, defined by a, of said first image region through said overview slice image in a projection direction, and a distance d in said at least one phase coding direction of a center point of said first image region from a center point of said projection defined by a and s.

3. A method as claimed in claim 2 wherein the step of expanding said first image region comprises expanding said width a of said first image region to a width b, according to $$b = \frac{a+s}{2} + |d|.$$

4. A method as claimed in claim 1 comprising expanding said first image region in two different phase coding directions.

5. A method as claimed in claim 1 wherein said magnetic resonance tomography apparatus has a basic field magnet that emits a homogenous basic magnetic field within a homogeneity volume, and comprising expanding said first image region to cause a center of said second image region to substantially coincide with a center of said homogeneity volume.

6. A magnetic resonance tomography apparatus comprising:
   a magnetic resonance scanner configured to interact with a subject to obtain magnetic resonance data from said subject; and
   a control unit connected to said magnetic resonance scanner that operates said magnetic resonance scanner to acquire magnetic resonance data in a single RF reception channel of said scanner representing an overview slice image across an entirety of a selected slice of said subject, and that detects a marking input of a first image region in said overview slice image and that electronically expands said first image region in at least one phase coding direction, dependent on a geometry of said first image region, said overview slice image, and respective positions of said first image region and said overview slice image relative to each other, so as to identify a second image region that is expanded compared to said first image region, and that operates said scanner to acquire oversampled magnetic resonance data in said single RF reception channel from said second image region that completely contains said first image region and is free of foldovers in said first image region, and that makes said oversampled data accessible from said control unit in a form suitable for reconstructing a magnetic resonance image of said second image region by Fourier transformation.

7. A computer-readable medium encoded with a data structure, and loadable into a computerized control unit of a magnetic resonance tomography apparatus, said data structure causing said control unit to operate said magnetic resonance tomography apparatus to:
   acquire magnetic resonance data representing an overview slice image across an entirety of a selected slice of a subject in a single RF reception channel of the magnetic resonance tomography apparatus;
   detect a marking input designating a first image region in said overview slice image;
   electronically expand said first image region in at least one phase coding direction, dependent on a geometry of said first image region, said overview slice image, and respective positions of said first image region and said overview slice image relative to each other so as to identify a second image region that is expanded compared to said first image region; and
   operate said magnetic resonance tomography apparatus to obtain magnetic resonance data in said single RF reception channel from said subject corresponding to said second image region that completely contains said first image region and is free of foldovers in said first image region; and
   make said oversampled data accessible from said control unit in a form suitable for reconstructing a magnetic resonance image of said second image region by Fourier transformation.

8. A method for operating a magnetic resonance tomography apparatus comprising:
   acquiring magnetic resonance data from a magnetic resonance tomography apparatus that represent an overview slice image across an entirety of a subject to be examined in a selected slice;
   in said overview slice image, detecting a marking input of a first image region;
   in a control unit of said magnetic resonance tomography apparatus, electronically expanding said first image region in at least one phase coding direction, dependent on a geometry of said first image region, said overview slice image and respective positions of said overview slice image and said first image region relative to each other, so as to identify a second image region that is expanded compared to said first image region;
   with said control unit, operating said magnetic resonance tomography apparatus to acquire oversampled magnetic resonance data from said second image region of said subject, that completely contains said first image region and that is free of foldovers in said first image region; and
   making said oversampled data accessible from said control unit in a form suitable for reconstructing a magnetic resonance image of said second image region by Fourier transformation.

9. A method as claimed in claim 8 comprising employing, as said geometry, a width a of said first image region in said at least one phase coding direction, a maximum width s of a parallel projection, defined by a, of said first image region through said overview slice image in a projection direction, and a distance d in said at least one phase coding direction of a center point of said first image region from a center point of said projection defined by a and s.

10. A method as claimed in claim 9 wherein the step of expanding said first image region comprises expanding said width a of said first image region to a width b, according to $$b = \frac{a+s}{2} + |d|.$$

11. A method as claimed in claim 8 comprising expanding said first image region in two different phase coding directions.

12. A method as claimed in claim 8 wherein said magnetic resonance tomography apparatus has a basic field magnet that emits a homogenous basic magnetic field within a homogeneity volume, and comprising expanding said first image region to cause a center of said second image region to substantially coincide with a center of said homogeneity volume.

13. A magnetic resonance tomography apparatus comprising:

a magnetic resonance scanner configured to interact with a subject to obtain magnetic resonance data from said subject; and a control unit connected to said magnetic resonance scanner that operates said magnetic resonance scanner to acquire magnetic resonance data representing an overview slice image across an entirety of a selected slice of said subject, and that detects a marking input of a first image region in said overview slice image and that electronically expands said first image region in at least one phase coding direction, dependent on a geometry of said first image region, said overview slice image, and respective positions of said first image region and said overview slice image relative to each other, so as to identify a second image region that is expanded compared to said first image region, and that operates said scanner to acquire oversampled magnetic resonance data from said second image region that completely contains said first image region and is free of foldovers in said first image region, and that makes said oversampled data accessible from said control unit in a form suitable for reconstructing a magnetic resonance image of said second image region by Fourier transformation.

14. A computer-readable medium encoded with a data structure, and loadable into a computerized control unit of a magnetic resonance tomography apparatus, said data structure causing said control unit to operate said magnetic resonance tomography apparatus to:

acquire magnetic resonance data representing an overview slice image across an entirety of a selected slice of a subject in the magnetic resonance tomography apparatus;

detect a marking input designating a first image region in said overview slice image;

electronically expand said first image region in at least one phase coding direction, dependent on a geometry of said first image region, said overview slice image, and respective positions of said first image region and said overview slice image relative to each other so as to identify a second image region that is expanded compared to said first image region; and operate said magnetic resonance tomography apparatus to obtain magnetic resonance data from said subject corresponding to said second image region that completely contains said first image region and is free of foldovers in said first image region; and make said oversampled data accessible from said control unit in a form suitable for reconstructing a magnetic resonance image of said second image region by Fourier transformation.

* * * * *